United States Patent [19]

Purdes et al.

[11] Patent Number: 4,513,021
[45] Date of Patent: Apr. 23, 1985

[54] PLASMA REACTOR WITH REDUCED CHAMBER WALL DEPOSITION

[75] Inventors: Andrew J. Purdes; Thomas D. Bonifield, both of Garland, Tex.

[73] Assignee: Texas Instruments Incorporated, Dallas, Tex.

[21] Appl. No.: 549,217

[22] Filed: Nov. 7, 1983

Related U.S. Application Data

[63] Continuation of Ser. No. 344,590, Feb. 1, 1982, abandoned.

[51] Int. Cl.³ ............................................. B05D 3/06
[52] U.S. Cl. ...................................... 427/38; 427/39; 427/94; 118/723
[58] Field of Search ............... 118/723, 725, 730, 728, 118/715, 50.1; 427/38, 39, 95, 94, 225.1; 156/643; 315/111.01

[56] References Cited

U.S. PATENT DOCUMENTS

| | | | |
|---|---|---|---|
| 4,181,564 | 1/1980 | Fogarty et al. | 427/94 X |
| 4,282,267 | 8/1981 | Kuyel | 427/38 |

Primary Examiner—John D. Smith
Assistant Examiner—Bernard F. Plantz
Attorney, Agent, or Firm—William E. Hiller; James T. Comfort; Melvin Sharp

[57] ABSTRACT

A plasma reactor wherein material deposition on the sidewall is substantially prevented. In a radial flow reactor, wherein the reagent gases are injected at periphery of an annular substrate holder and exhausted near the center of the holder, a second gas flow of diluent gases is provided, which also flows radially to be exhausted at the center of the substrate holder. Since the diluent gas flow begins outboard of the reagent gas flow, the gas flow across the reagent gas injection nozzles prevents reagent gases from flowing outward. Thus, the gas adjacent to the chamber wall is almost entirely composed of the inert diluent gas, and material deposition on reactor walls is prevented.

6 Claims, 3 Drawing Figures

PLASMA REACTOR WITH REDUCED CHAMBER WALL DEPOSITION

This application is a continuation of application Ser. No. 344,590, filed Feb. 1, 1982 now abandoned.

BACKGROUND OF THE INVENTION

The present invention relates to a plasma reactor.

Where a plasma reactor is used to deposit a film atop a substrate, unwanted deposition of the material on passive surfaces within the reactor is a common result. In particular, where loose material is deposited, which may subsequently be transported back into the exposed areas of a device being processed, variable and undesired device characteristics may result.

For the plasma deposition of silicon nitride films, it is sometimes advantageous to use high flows (approximately 100 cc/min) of the pure reactant gases, $SiH_4$ and $NH_3$. These high reactant flows allow a rapid (300 Å/min) deposition rate of silicon nitride on heated (300° C.) substrates while maintaining desirable film properties such as compressive film stress. It has been found, however, that a loose powder may form on the cooled lid and sidewalls of the reactor when these high reactant flows are used. This powder formation is undesirable as it is a source of particulates which can degrade the mechanical integrity of the silicon nitride deposit on the heated substrates. This is an outstanding problem in every plasma-assisted chemical vapor deposition process. It is of particular concern in nitride deposition since plasma CVD is the most convenient way to deposit nitride.

A schematic of the radial flow plasma reactor concept (U.S. Pat. No. 3,757,733) is shown in FIG. 1. Reactant and diluent gases are introduced below the substrated plate, flow radially inward between the rf electrode and the substrate holder, and are pumped out of the reactor. The plasma which is excited between the rf electrode and the substrate holder allows the deposition of silicon nitride or other compounds at a relatively low substrate temperature (approximately 300° C).

Using a 24-inch reactor, approximately 60 watts of rf power are required to deposit a uniform silicon nitride film over the entire surface of the heated substrate holder. This power level can result in deposited film properties, such as low density and tensile stress, which may be undesirable. Higher power levels (several hundred watts), however, result in a plasma glow beneath the substrate plate. This glow results in premature activation of the reactants, resulting in a thich deposit near the periphery of the substrate holder and a thin deposit near its center.

A method for suppressing the plasma glow beneath the substrate plate and increasing the usable rf power level was described in U.S. Pat. No. 4,033,287. A schematic of this reactor arrangement is shown in FIG. 2. The reactant and diluent gases are piped into a gas distribution ring located on the periphery of the substrate holder. It was demonstrated that the useful power level could be increased to several hundred watts, allowing control of film properties over the entire area of the substrate holder.

Thus, it is an object of the present invention to provide a method for operating a plasma reactor for deposition of materials on substrates within the reactor, such that material is not also deposited on the sidewalls of the reactor.

It is a further object of the present invention to provide an improved plasma reactor for deposition of silicon nitride films, such that high flows of the reagent gases may be used without depositing granular silicon nitride on the sidewalls.

SUMMARY OF THE INVENTION

To achieve the above objects and other advantages, the present invention provides a radial flow plasma reactor of a type similar to U.S. Pat. No. 3,757,733, but including a gas delivery ring for reactant gases and located at the outer perimeter of the heated substrate holder plate in combination with a diluent gas inlet. In the latter respect, the diluent gas is disposed above the rf electrode and is connected to an annular manifold having spaced holes arranged about the perimeter thereof. Diluent gas is introduced into the chamber of the plasma reactor via the reaction holes in the annular diluent gas manifold disposed over the rf electrode. The diluent gas may be nitrogen, helium or argon, for example, and reduces the diffusion of reactants onto the cold lid and sidewalls of the reactor, so as to prevent powder formation of these surfaces. While this concept is described with particular attention to the plasma deposition of silicon nitride films, it is applicable to films of other materials, such as the deposition of silicon and silicon oxide layers. The present invention also reduces deposition of etching by products.

According to the present invention there is provided:
A plasma reactor, comprising:
a substrate holder;
an electrode parallel and opposed to said substrate holder;
means for introducing reagent gases over the circumference of said substrate holder;
means for exhausting gases near the center of said substrate holder; and
a diluent gas inlet at a location apart from the space defined between said substrate holder and said electrode, said diluent gas inlet being positioned such that the gas flow path between said diluent gas inlet and said exhaust means is substantially circumferentially symmetric with respect to said substrate holder.

BRIEF DESCRIPTION OF THE DRAWINGS

The present invention will be described with reference to the accompanying drawings, wherein.

DESCRIPTION OF THE PREFERRED EMBODIMENT

The present invention will be described with particular reference to the problem of deposition of silicon nitride without formation of granular silicon nitride deposited on the sidewalls. However, it will be appreciated by those skilled in the art that other deposition and etching processes may also advantageously be performed using the plasma reactor of the present invention.

It would be highly desirable to be able to deposit silicon nitride at high power levels, e.g. 600 watts per substrate holder. Such high powers should not only improve the properties of the deposited film, but would also provide high throughput in the production process.

Figure 1:
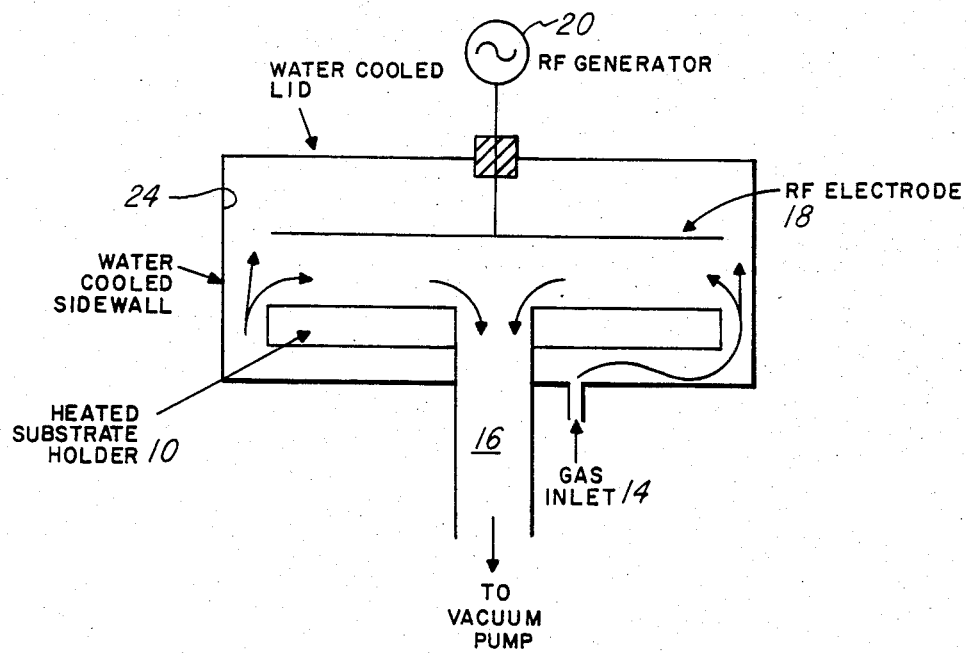
FIG. 1 shows a simplified version of a prior art radial flow plasma reactor.
Figure 2:
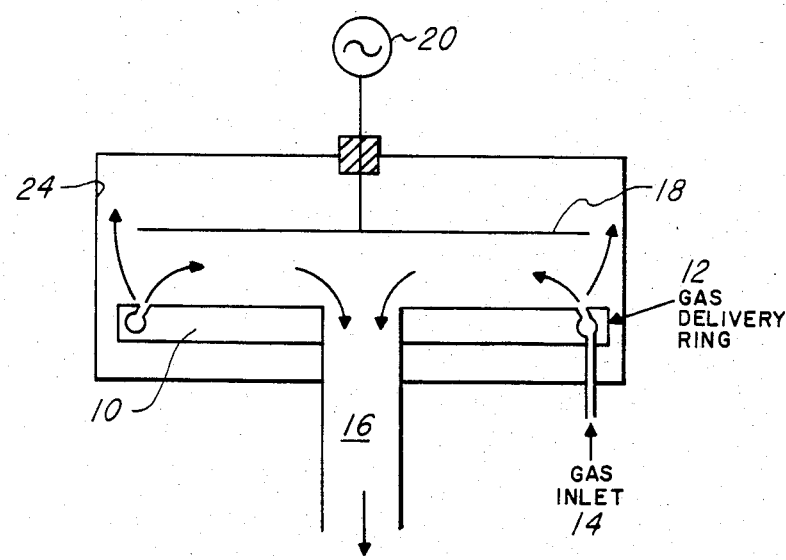
FIG. 2 shows a radial flow plasma reactor which incorporates an annular gas delivery ring within the substrate holder, according to the prior art.

However, attempts to use such high power levels in prior art reactors, such as that shown in FIG. 2, result in heavy loose powder deposits on the lid and sidewall of the reactor. These deposits are extremely undesirable, as they are a potential source of particulates in subsequent processing. The present invention overcomes the problem of unwanted particulate deposition by the following arrangement. In a plasma reactor which includes a substrate holder 10, an annular reagent gas manifold 12 connected to a reagent gas inlet 14, an exhaust outlet 16 at the center of the substrate holder 10, an electrode 18 opposed to the substrate holder 10, and an rf power supply 20 connected to the electrode 18, the present invention provides a diluent gas inlet 22, whereby a gas flow is maintained across the reagent gas manifold 12 which causes the bulk of the reagent gas to be transported directly toward the exhaust 16. Thus, the gas layer adjacent to the reactor sidewall 24 contains a very low concentration of reagent gases, and consequently only a very small amount of material is deposited on the sidewalls 24. Preferably an annular diluent gas manifold 22 is used to ensure circumferentially uniform distribution of diluent gas pressure, but this is not necessary to practice the present invention.

Using this apparatus, a high flow of diluent gas, e.g. twice the flow of reagent gas, is introduced through the diluent gas inlet 22, while reagent gases are introduced through reagent gas inlet 14 and rf power is applied. The result is that the formation of powder above the rf electrode and on the sidewalls of the reactor is greatly reduced.

In the presently preferred embodiment, the diluent gas is introduced through a diluent gas manifold 22, consisting of a six inch diameter ring of stainless steel tubing having six equally spaced holes. The purpose of this arrangement is to distribute the diluent gas uniformly. Of course, many similar plumbing arrangements could be used to achieve the required uniformity of flow. For example, a second diluent gas inlet may be positioned behind the substrate holder. However, reagent gases are not as undesirable behind the substrate holder, since there is no discharge and hence no deposition. The presently preferred embodiment places the diluent gas manifold near the top center of the reactor so that small flow nonuniformities resulting from mechanical inaccuracies in the plumbing will be damped out before the nonuniformities can be transported to the periphery of the rf electrode.

Although many combinations of reactant and diluent flows may be used with the arrangement shown in FIG. 3, a typical set of conditions is as follows:

Power: 400 watts
Pressure: 400 milli Torr
$SiH_4$ Flow: 150 scc/min
$NH_3$ Flow: 350 scc/min
$N_2$ Flow: 850 scc/min
Temperature: 300° C.
Electrode-Substrate Spacing: 1 inch Under these conditions, diffusion will dominate over bulk flow. Good laminar flow is obtained, but inhomogeneous boundary layers are absent. This set of deposition conditions results in a deposition rate of approximately 350 Å/min. The resultant silicon nitride films have good mechanical integrity.

Figure 3:
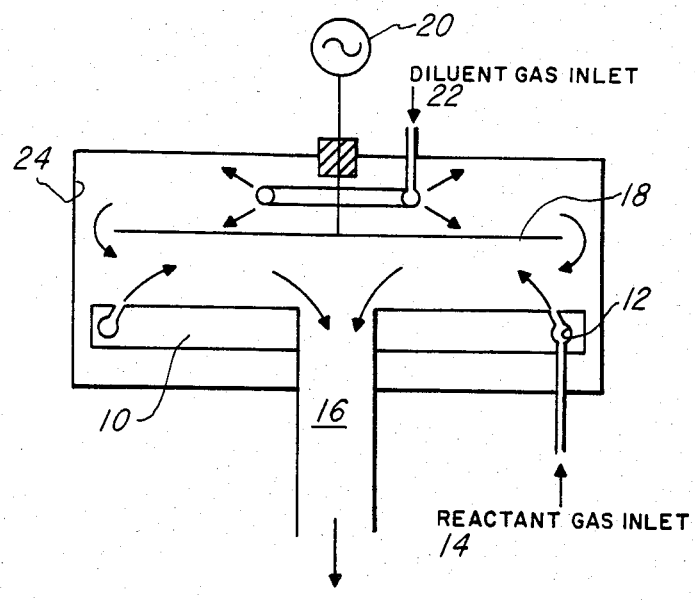
FIG. 3 shows the plasma reactor of the present invention, incorporating a separate diluent gas manifold.

The arrangement shown in FIG. 3 is useful for the plasma deposition of films other than silicon nitride. For example, both silicon and silicon dioxide deposition can benefit from using this arrangement.

Plasma etching is also performed in planar plasma reactors. For certain etches, the interaction of the active etch species with the reactor sidewalls and electrode can influence the etching of substrates. The arrangement in FIG. 3 largely confines the etch species reactions to the space between the rf electrode and the sidewalls.

For example, fluorocarbon gases are commonly used to etch oxide selectively with respect to silicon. Formation of tough fluorocarbon polymer normally occurs when the oxide has been etched away, but the reactor of the present invention reduces deposition of these polymers on chamber walls.

A similar problem of polymer deposition occurs in aluminum etching, where polymerizing agents are used to increase anisotropy. Again, the reactor of the present invention reduces unwanted chamber-wall deposition.

A further advantage provided by the inventive plasma reactor is the possibility of predissociation, using the same physical arrangement. Since a glow discharge will also occur on the upper surface of the electrode, the diluent gases pass through this glow discharge. If one of the reagent gases is introduced through the diluent gas manifold, partial predissociation of that reagent gas occurs, resulting in greater efficiency.

What is claimed is:

1. A method for plasma-assisted deposition of materials, comprising the steps of:

providing a plasma reactor having a reaction chamber defined at least in part by sidewalls and including therein a substrate holder and an electrode parallel to and opposed to said substrate holder in spaced relation therewith;

introducing reactant gases into the reaction chamber of said plasma reactor at a first location and in a manner directing the reactant gases over the circumference of said substrate holder and radially inwardly with respect thereto, wherein said reactant gases are of respective chemical identities to produce a desired chemical material deposition as a reaction from a plasma formed therefrom;

creating an electric field within the reaction chamber in the space between said electrode and said substrate holder;

forming a plasma from the reactant gases in response to the creation of the electric field within the reaction chamber in the space between said electrode and said substrate holder;

exposing a substrate on said substrate holder to said plasma;

depositing the desired chemical material from said plasma as a coating on said substrate;

introducing diluent gas into the reaction chamber of said plasma reactor separately from the introduction of said reactant gases but while said reactant gases are being introduced into the reaction chamber at a second location apart from the space between said electrode and said substrate holder and different from said first location and in a manner directing the diluent gas flow along the internal sidewall surfaces of the reaction chamber in substantially circumferentially symmetric relation with respect to said substrate holder so as to deter the deposition of the desired chemical material from said plasma onto the internal sidewall surfaces of the reaction chamber; and exhausting gases of the reacted plasma and the diluent gas from the reaction chamber via a location near the center of said substrate holder.

2. A method as set forth in claim 1, wherein the electric field created in the space between said electrode and said substrate holder is provided by applying rf power between said electrode and said substrate holder as the reactant gases and said diluent gas are being introduced into the reaction chamber of said plasma reactor.

3. A method as set forth in claim 1, wherein the introduction of diluent gas into the reaction chamber of said plasma reactor is accomplished at said second location which is situated above said electrode and centrally disposed with respect thereto such that the diluent gas flow is initially directed radially outwardly with respect to said electrode and subsequently downwardly along said internal sidewall surfaces of the reaction chamber of said plasma reactor prior to the exhausting thereof from the reaction chamber.

4. A method as set forth in claim 3, wherein the diluent gas flow is directed along the internal sidewall surfaces of the reaction chamber so as to be disposed radially outwardly with respect to said first location at which the reactant gases are introduced into the reaction chamber of said plasma reactor.

5. A method as set forth in claim 1, wherein said reactant gases introduced into the reaction chamber include silane and ammonia.

6. A method as set forth in claim 5, wherein said diluent gas is nitrogen.

* * * * *